United States Patent [19]

Quick

[11] 4,409,087

[45] Oct. 11, 1983

[54] WAFER DETECTION CIRCUITRY FOR HIGH VACUUM USE

[75] Inventor: Donald L. Quick, Mountain View, Calif.

[73] Assignee: The Perkin-Elmer Corp., Norwalk, Conn.

[21] Appl. No.: 379,402

[22] Filed: May 18, 1982

[51] Int. Cl.³ .............................................. C23C 15/00
[52] U.S. Cl. ............................... 204/298; 204/192 R; 204/192 SP; 204/192 C; 198/502
[58] Field of Search ............. 204/298, 192 R, 192 SP, 204/192 C; 198/502

[56] References Cited

U.S. PATENT DOCUMENTS 4,351,714  9/1982  Kuriyama ........................... 204/298
4,352,725  10/1982  Tsukada .............................. 204/298

OTHER PUBLICATIONS

Mazza, I.B.M. J. Res. Develop. 14 (1970) No. 2, pp. 192–193.

Primary Examiner—Arthur P. Demers
Attorney, Agent, or Firm—S. A. Giarratana; T. P. Murphy; J. R. Dwyer

[57] ABSTRACT

Disclosed is a detector for determining the location of wafers moving in a sputtering system, for example, to and from the sputtering chamber where the wafers are processed, including a capacitive transducer, located in the path of travel of the wafers, to which is coupled an oscillator supplying a constant current thereto. This current is detected by a sensor, whose output is processed and applied to a comparator. The comparator is preferably preset to supply a digital "0" when the current through the transducer is at a static or no-wafer condition, and a digital "1" when the capacity of the transducer changes due to the presence of a wafer in close proximity to the transducer which is sensed as an increase in current which is reflected as a change of voltage level applied to the comparator.

6 Claims, 3 Drawing Figures

WAFER DETECTION CIRCUITRY FOR HIGH VACUUM USE

BACKGROUND OF THE INVENTION

This invention relates to a new and improved detector for determining the location (position) of deposition substrates (wafers) as they are being transported from one point to another in a high vacuum RF and DC sputtering system.

High vacuum sputtering systems for the deposition and/or etching of material on a wafer in the manufacture of integrated circuits are well known. Such a system typically comprises a first airlock loading chamber in which cassettes containing a plurality of wafers to be processed are placed and from which the wafers are transported through a second vacuum chamber or transportation chamber by any suitable conveyor and are then placed on a rotating table or stage within the sputtering chamber. In this chamber the wafers to be processed are rotated in the presence of RF or DC voltage for the deposition or etching of material on the wafer. After the sputter processing, the processed wafers are again transported back through the transportation chamber and into the loading chamber and into the cassette to be removed for further handling/processing.

For the proper operation of the system, it is necessary to provide the microprocessor, which controls the system's operation, with accurate information regarding the location, presence or absence, of wafers along the path between the loading chamber and sputtering chamber. In order to do this, any wafer detector must operate in high vacuum and in a high voltage DC and RF environment. To those skilled in the art, it will be clear that the detector, or more specifically the transducer, selected must not "outgas" under conditions of high vacuum, and not only the transducer but its associated circuitry must function in this DC and RF environment.

SUMMARY OF THE INVENTION

A transducer of a fixed capacitance, located in the path of wafers moving in a sputtering system, is supplied with a constant current from a two-stage oscillator whereby current is detected by a sensor, rectified and applied to a comparator. The comparator is, preferably, set to respond digitally to indicate the absence or presence of a wafer near the transducer.

The constant current applied to the transducer is developed by a two-stage oscillator as a voltage of triangular waveform output of a predetermined amplitude which is applied to one plate of the transducer. An inverting operational amplifier, connected to the second plate of the transducer, senses the current from the oscillator as a function of the capacity of the transducer. The output from the sensor is rectified to provide a DC voltage output whose level is a function of the current sensed and which is applied to the comparator. The comparator is preferably preset by a threshold voltage applied thereto to nearly equal the DC voltage output level from the rectifier at a static or "no-wafer" condition of the transducer. This is seen as a digital "0" output from the comparator. With a wafer moving into close proximity to the transducer, the sensor will increase the amplitude of its output signal as a function of the increase in the capacity of the transducer caused by this wafer. This will change the DC voltage level applied to the output comparator which will output a digital "1" indicating a wafer at or near the transducer.

As will be clear to those skilled in the art, the circuit is essentially a nulling circuit under no-wafer conditions, that the current sensor and circuitry are immune to the capacitance of the shielded cables and that the transducer and its associated circuitry will operate in a DC or RF high vacuum environment.

DETAILED DESCRIPTION

Figure 1:
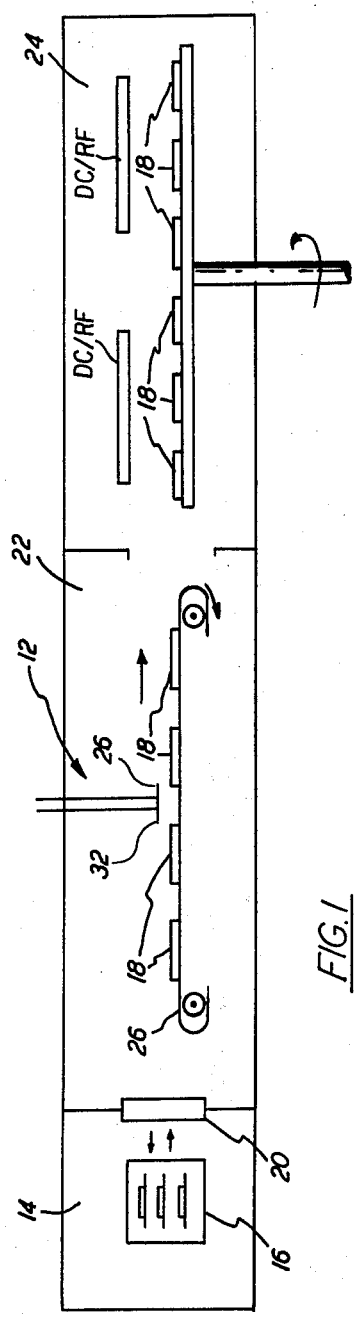
FIG. 1 is a block diagram illustrating schematically the sputtering system in which the detector, constructed in accordance with the teachings of this invention, is advantageously employed and showing the location of one such detector in the transportation chamber.
Figure 2:
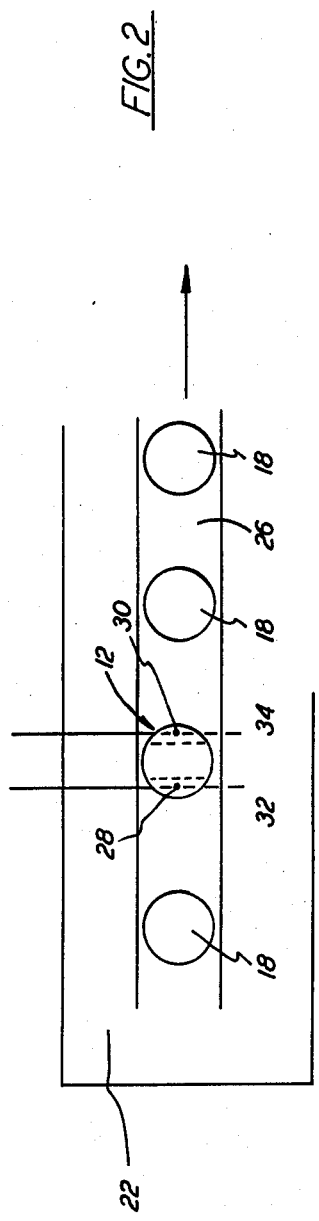
FIG. 2 is a top plan view, also schematic, illustrating the position of the detector with respect to the wafers as they are being transported in the transportation chamber.

FIGS. 1 and 2 illustrate the sputtering system 10 in which the present invention is advantageously employed. For the purposes of illustration, only one detector 12, constructed in accordance with the teachings of this invention, is shown, although many such detectors may be located in the system.

As can be seen from these Figures, in the system there is provided an input or loading chamber 14, shown only as a block diagram, in which one or more cassettes 16 containing a number of wafers 18 to be processed is placed. Means (not shown) for withdrawing said wafers to be processed and for reinserting the processed wafers to and from the cassette are in this chamber. This chamber is provided with an airlock 20 so that the wafers may be inserted into and withdrawn from this loading chamber without disturbing the high vacuum in the other chambers thus reducing the down-time that would otherwise result due to pumping down the larger chambers. The other chambers, also shown as block diagrams, include a transportation chamber 22 and a sputtering chamber 24. In the transportation chamber 22, the wafers 18 are transported from the loading chamber to the sputtering chamber 24 where the wafers are processed. The transportation chamber includes a suitable means to transport the wafers, such as a movable belt 26 on which the wafers are placed, and means (not shown) for placing the unprocessed wafers onto a rotating table within the sputtering chamber, on which the wafers are processed, and to remove the processed wafers from lthe rotating table onto a return belt (not shown) which returns the wafers to the loading chamber 14 where they are reinserted in the cassettes 16 and ultimately removed from the system. (Only one belt moving wafers in the direction of the sputtering chamber is shown for simplicity of disclosure.)

FIG. 2 is a top plan view of the transportation chamber in which there is shown a plurality of wafers on the moving belt 26 suitably spaced apart and a transducer 28 comprising a thin flat sheet, preferably ceramic, insulator 30 having two metal sensor plates 32 and 34 on one side. The transducer 28 forms part of the detector 12 of this invention. Preferably, this transducer 28 is formed by sputtering metal on one side of the ceramic sheet 30 after which a central area of the plating is removed, separating each half of the plated surface into plates forming a capacitor whose plates lie in the same plane. This transducer 28, having a known small capacitance, is located in close proximity to the wafers in their path of travel and the presence of the wafer at the transducer location wll be reflected in a change of capacitance which is sensed by the detector circuitry of this invention which will now be described.

Before describing the circuitry in detail and its specific operation, however, an overview is thought to be important.

Figure 3:
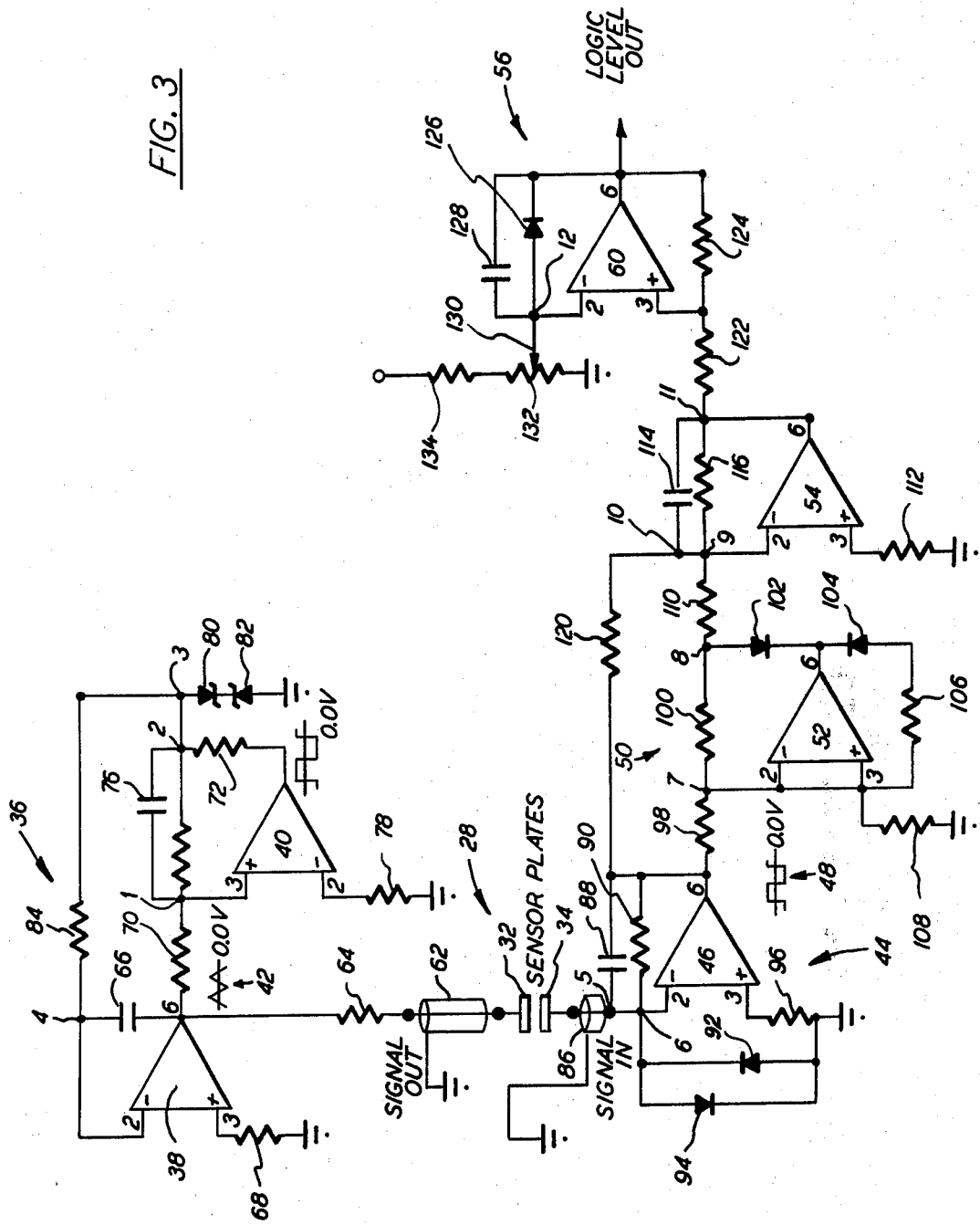
FIG. 3 is a schematic diagram illustrating the circuitry of this invention.

As can be seen from FIG. 3, the sensor plates 32 and 34 of the transducer 28 discussed above, are shown as conventional face-to-face capacitor plates. One plate 32 is connected to a function generator (oscillator) 36 comprising two operational amplifiers 38 and 40 and their attendant circuitry to provide sensor plates 32 and 34 with a constant current resulting from the triangular voltage waveform 42 developed at the output terminal of the first amplifier 38.

The second plate 34 is connected to a current sensor 44 comprising a third operational amplifier 46 and attandant circuitry for sensing the current induced in the second plate 34. The current sensed by the sensor 44 is represented by the voltage waveform 48. Actually, this amplifier will sense a change in capacitance by sensing a change in current flow by the presence of a wafer in the proximity of the transducer plates. The output of this third amplifier 46 is connected to a rectifier network 50 comprising two operational amplifiers 52 and 54 and attendant circuitry which provides a DC voltage to a comparator 56 comprising a sixth operational amplifier 60 and its attendant circuitry as a function of the amplitude of the signal at the output terminal of the third amplifier 46. Comparator 56 compares the voltage between the DC voltage level received at the amplifier 60 and a selected threshold voltage level. Thus, the output from the comparator will be a digital output reflecting the presence or absence of a wafer in the area immediate to the sensor plates.

Now for a more detailed description of the circuitry of FIG. 3, it is first noted that the above mentioned sensor plates 32 and 34 are shown as conventional face-to-face capacitor plates simply to illustrate their function in the circuitry. Plate 32 is connected to the center conductor of a grounded shield coaxial cable 62, while the driven end of the cable center conductor is connected through a limiting resistor 64 to the output terminal of the first operational amplifier 38. Negative feedback is provided via capacitor 66 from the output terminal to the inverting input terminal of the amplifier. The non-inverting input terminal is connected via a bias resistor 68 to ground. The output of the operational amplifier is also connected through an input resistor 70 to node 1, and to the non-inverting input terminal of the second operational amplifier 40. This amplifier has a positive feedback loop by the connection of its output terminal via a resistor 72 to node 2, and a second feedback resistor 74, to the non-inverting input terminal through node 1. A capacitor 76 is connected between node 1 and node 2 and thus is in parallel with the feedback resistor 74 in this loop. The inverting input terminal of the second operational amplifier 40 is connected through a bias resistor 78 to ground. The end of the resistor 72 opposite the output terminal of the second operational amplifier 40, i.e., at nodes 2 and 3, connects to the anode of a first zener diode 80, which is connected back-to-back (cathode-to-cathode) to a second zener 82 diode. The latter's anode is, in turn, connected to ground. Node 3 and the anode of the zener diode 80 are also connected to another feedback resistor 84, and at node 4, to the capacitor 66 on the side opposite the output of the first operational amplifier 38 and to the inverting input of same. Both operational amplifiers, are, of course, coupled to positive and negative supply sources.

The circuitry described thus far can be seen to be a two-stage oscillator with operational amplifier 36 and its attendant circuitry functioning as an integrator and operational amplifier 38 and its attendant circuitry as a comparator or latch whose output will latch in either a positive or negative direction with respect to circuit ground. The latching capability is accomplished through the positive feedback network comprising resistors 72 and 74 and capacitor 76 with resistors 74 and 70 forming a voltage divider, the center (node 1) of which is connected to the non-inverting input to operational amplifier 38. Resistor 72 provides a current limiting function for the two zener diodes 80 and 82 thereby limiting and equalizing the output signals alternately appearing across the zener network. This eliminates inherent unequal output voltage saturation levels of operational amplifier 40.

As the comparator latches in a particular direction, a feedback current is applied to the inverting input of integrator 38, thereby causing its output terminal to linearly ramp. When the input signal at node 1 reaches a point where the input voltage at the comparator's non-inverting terminal is reversed in polarity, the output of the comparator will switch to the opposite polarity. Once this condition of reversed output polarity exists, the current to the inverting input of the integrator reverses, thereby causing the integrator to ramp its output in the opposite direction. The combined action of both stages thereby causes the circuit to oscillate at a frequency determined by the value of resistor 84 and capacitance 66.

The output terminal of the integrator provides an input signal to the comparator as well as signal current to the transducer plates.

Utilizing two commercially available operational amplifiers 741S and with the circuit component having the following values, the triangular 24 waveform has a frequency of 32 KHz.

| | |
|---|---|
| Resistor 70 | 51K |
| Resistor 74 | 270K |
| Resistor 72 | 1.5K |
| Resistors 84, 68 | 2.7K |
| Resistor 78 | 47K |
| Capacitor 66 | .0047 pF |
| Capacitor 76 | 50 pF |

The frequency is, of course, primarily determined by capacitor 66 and resistor 84 and may be varied depending upon the value selected for these components. The zener diodes are IN754 A's.

While shown with the back-to-back zener diodes 80 and 82 for maintaining the symmetry of the triangular waveform 42, these diodes may be eliminated from the circuit, since the function generator has an extreme frequency capability. In regard to stability of frequency, note that any increase in the power source ±Vcc to the comparator 40 would increase the output voltage saturation level of the comparator, thereby producing increased input current to the inverting input of the integrator. This would simply increase the slope of the ramp of the triangular waveform 42, thereby reaching a particular amplitude in a shorter time duration with the frequency remaining the same. This is due to the fact that the different voltage output from the comparator due to the change in Vcc voltage alters the junction voltage at node 1 of the resistive divider network which alters the threshold voltage at the input in order to compensate for the faster ramp or forcing said ramp to seek an increased amplitude excursion yielding once more the same amount of time.

Thus, with the output signal from the two-stage oscillator 36 at the output of the integrator 38 connected to the sensor plate 32 in the form of a triangle with linear ramps of a certain duration and amplitude, the current to the transducer being constant and linear, and this current as a function of the capacity of the transducer, is sensed and processed by the remaining circuitry which will now be described in detail.

The second plate 34 of the transducer 28 is connected via a second grounded shield coaxial cable 86, at nodes 5 and 6, to the inverting input terminal of the third operational amplifier 46 which forms part of the current sensor 44. The inverting input terminal is also connected to one side of a capacitor 88 and to one end of a resistor 90 which is connected in parallel with the capacitor 88. This same side of capacitor 88 and end of resistor 90 is connected to the center conductor of coaxial cable 86. The other end of said capacitor 88 and the other end of resistor 90 are both connected to the output terminal of this amplifier. A pair of diodes 92 and 94 are connected in opposite polarities between the inverting input terminal of the operational amplifier 46 and ground to protect the amplifier against extraneous high amplitude voltages. The output of the operational amplifier 46 is also connected via another resistor 98 to node 7 and to the inverting input of the fourth operational amplifier 52 which forms part of the rectifier 50. Node 7 is also connected through a second resistor 100 to node 8 and to the anode of a first diode 102. Diode 102 has its cathode connected to the output of this fourth amplifier 52. This output is also connected to the anode of a second diode 104 whose cathode is connected to another resistor 106 back to the inverting input of the operational amplifier 52. The non-inverting input to the operational amplifier 52 is connected via a bias compensating resistor 108 to ground. At node 8, a resistor 110 is connected through node 9 to the inverting input of the fifth operational amplifier 54. The non-inverting input to amplifier 54 is connected to ground through bias compensating resistor 112. Node 9 is also connected via node 10 to a capacitor 114 and resistor 116 in parallel therewith and to the output of this latter amplifier. Thus, capacitor 114 and resistor 116 form a negative feedback loop for the operational amplifier 54. Nodes 9 and 10, also connect resistor 110, capacitor 114 and resistor 116 to another resistor 120 and to the output of the third amplifier 46.

The output of operational amplifier 54 and its negative feedback loop is connected at node 11 via a resistor 122 to the non-inverting input of operational amplifier 60. A second resistor 124 provides a slight positive feedback around operational amplifier 60. This operational amplifier forms part of comparator 56. The output of this operational amplifier has a negative DC feedback loop comprising diode 126 connected in parallel with AC feedback capacitor 128, both of which are connected at node 12 to the inverting input of this operational amplifier. Node 12 connects the anode of diode 126, one side of capacitor 128, and the inverting input of amplifier 60, to the wiper 130 of a potentiometer 132, connected at one end to ground and at the other through a resistor 132 to +Vcc. The output of the operational amplifier 60 may be connected to a suitable device for detecting the presence or absence of a wafer in proximity to transducer 28.

From the circuitry thus far described, it can be seen that the operational amplifier 46 is connected as a follower for DC conditions with its inverting input terminal provided with negative feedback between its output terminal and the summing node 6, completing the loop comprising resistor 90 and capacitor 88. Current amplification is performed by the operational amplifier 46 utilizing the capacitance 88 to produce the AC feedback to the inverting terminal. The output of the amplifier is inversely proportional to the ratio of the feedback capacitance to the capacitance of the plates of the transducer. Thus, when a wafer comes into proximity of the transducer, the effective capacitance of the transducer is increased, increasing the amplitude of the output signal of comparator 46. Actually, as can be seen from the square wave form 48, the comparator is sensing the rate of change of current at the sensor plates and the flat portions of the square wave correspond to the time that the charge to the sensor plates is constant, i.e., the ramp portions of the triangular wave form 42, and the vertical lines represent the rate of change at zero velocity, i.e., at the peaks of the triangular wave form 42. Again, the amplitude of the flat horizontal portions of the wave form will increase upon an increase in the capacitance formed by the proximity of a wafer to the sensor plates.

Rectifier 50 with amplifiers 52 and 54 is a conventional rectifier filter with the resistance values of resistors 98, 100 and 110 selected to provide the proper rectified output at node 11. Since the rectifier is conventional, its detailed operation need not be described, but reference is made to *The Handbook of Operational Amplifier Applications*, Burr-Brown Research Corporation, Post Office Box 11400, Tucson, Ariz. 85706, at page 73 for a more detailed explanation of this circuit.

The output from the rectifier 50, being a DC representation of the square wave output 48, is applied to the non-inverting input terminal of operational amplifier 60 of comparator 56 which is connected in positive feedback relationship to its output. The inverting input terminal of this operational amplifier is subject to the threshold voltage of the potentiometer 32 and preferably of a value equal to the voltage applied to the non-inverting terminal from rectifier 50 so that under a no-wafer condition, the output from the comparator represents a logic "0." At this time, it can be appreciated that the circuit is essentially a nulling circuit with the capacitances of the sensor plate and the connecting cables being referenced to essentially 0.0 voltage. A changing capacitance, i.e., an increase in capacitance at the sensor plates by the presence of a wafer at these plates, will cause an increase in the current sensor output represented by greater amplitude of the square wave 48, which is rectified and applied as an increased voltage to the operational amplifier 60, which in turn compares this voltage with the threshold voltage. Since the voltage level from the rectifier is now higher, an increase in the signal output level of the operational amplifier will result representing a logic "1."

In this portion of the circuitry the operational amplifiers are 741s, and the circuit components have the following values and numbers for a typical operational circuit:

| Resistors 90, 96 | 180K |
|---|---|
| Resistors 98, 100, 106, 116, 120, 122, 132 | 10K |
| Resistor 110 | 5K |
| Resistor 106 | 5.1K |
| Resistor 112 | 2.7K |
| Resistor 124 | 4.7K |
| Resistor 132 | 120K |
| Diodes 92, 94 | 914 s |
| Diodes 102, 104 | 5082-2800 |
| Diode 126 | 91407 |
| Capacitor 88 | 15 pF |
| Capacitor 114 | 0.47 µF |
| Capacitor 128 | .0022 F |

As will be apparent to those skilled in the art, the sensor plates 32 and 30 act as a variable capacitor due to the presence or absence of a wafer in close proximity thereto and once the circuit is adjusted (nulled), very small changes of capacitance due to the presence or absence of a wafer affects a very large increase in the gain of the amplifier 46. This is because the sensor plates are coupled with respect to the capacitor 88 and the non-inverting input of the amplifier in such a manner as to change amplifier gain proportionately inversely to capacitance change.

Also, cable capacitance is of no consequence to the oscillator because of its low impedance output, and of no consequence to the sensor (amplifier 46) because the cable center conductor is connected to the summing junction node 6, i.e., the inverting input of the amplifier which is at virtual ground (due to the capacitance feedback loop around the amplifier). Thus, for all practical purposes, cable capacitances disappear from the circuit and thus do not affect capacitance change at the sensor plates reflecting a presence or absence of a wafer thereat. In other words, although cable capacitance may be of several hundred pf, a change of only about 1 pf change due to the presence of a wafer will be detected.

What is claimed is:

1. In a sputtering system having wafers moving to and from a sputtering chamber, a detector located at a selected position for detecting the presence or absence of wafers at said position in their path of travel in said sputtering system comprising, transducer means having a pair of sensor plates defining a fixed capacitance and located in the path of travel of said wafers, current generating means for providing a constant current to said sensor plates which can be sensed as an output current signal from said sensor plates, the sensor plates being positioned such that a wafer in close proximity thereto changes the output current of said sensor plates, and current sensing means for sensing said output current and providing an output signal representative of said output current.

2. The detector as claimed in claim 1 further including comparator means for comparing the output signal from said signal sensing means to another signal source which will then enable said comparator to provide one signal output when no wafer is in close proximity to said sensor plates and another signal output when a wafer is in close proximity to said sensor plates.

3. The detector as claimed in claim 1 wherein said current generating means comprises a two-stage oscillator producing a triangular signal output of a predetermined amplitude and frequency.

4. The detector as claimed in claim 1 wherein said current sensing means comprises an operational amplifier having a negative feedback loop with a capacitance in said negative feedback loop coupled to one of said sensor plates, to provide a net capacitance of a fixed amount in the circuit between the constant current source and said current sensing means.

5. The detector as claimed in claim 1 further including means for rectifying the signal output from said current sensing means to provide a DC output current level corresponding in value to the amplitude of the output signal from said current sensing means.

6. The detector as claimed in claim 2 wherein said comparator means comprises an operational amplifier with negative and positive feedback loops to its two input terminals, means for selecting the voltage level to one input terminal so as to form a basis of comparison of the voltage level applied to the other input terminal whereby equal voltages at said input terminals represent a digital "0" and unequal voltages at said input terminals represent a digital "1" as outputs from said comparator means.

* * * * *